(12) United States Patent
Brueckner et al.

(10) Patent No.: US 6,902,627 B2
(45) Date of Patent: Jun. 7, 2005

(54) CLEANING CHAMBER SURFACES TO RECOVER METAL-CONTAINING COMPOUNDS

(75) Inventors: Karl Brueckner, Santa Clara, CA (US); Hong Wang, Cupertino, CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 10/742,604

(22) Filed: Dec. 19, 2003

(65) Prior Publication Data

US 2004/0163669 A1 Aug. 26, 2004

Related U.S. Application Data

(63) Continuation-in-part of application No. 10/304,535, filed on Nov. 25, 2002.

(51) Int. Cl.[7] .............................................. C23G 1/02
(52) U.S. Cl. ........................... 134/3; 134/2; 134/22.1; 134/22.11; 134/22.14; 134/22.19; 134/26; 134/28; 134/41; 134/42; 134/902
(58) Field of Search ....................... 134/2, 3, 22.1, 134/22.11, 22.14, 22.19, 26, 28, 41, 42, 902

(56) References Cited

U.S. PATENT DOCUMENTS

| | | | |
|---|---|---|---|
| 4,756,322 A * | 7/1988 | Lami | 134/86 |
| 5,391,275 A | 2/1995 | Mintz | |
| 5,401,319 A | 3/1995 | Banholzer et al. | |
| 5,474,649 A | 12/1995 | Kava et al. | |
| 5,660,640 A * | 8/1997 | Laube | 134/1 |
| 5,910,338 A | 6/1999 | Donde et al. | |
| 5,916,454 A | 6/1999 | Richardson et al. | |
| H2087 H | 11/2003 | Balliett et al. | |
| 6,656,535 B2 * | 12/2003 | He et al. | 427/449 |
| 2002/0086118 A1 | 7/2002 | Chang et al. | |
| 2002/0170486 A1 * | 11/2002 | Zehavi et al. | 117/84 |
| 2003/0047464 A1 | 3/2003 | Sun et al. | |
| 2003/0116276 A1 * | 6/2003 | Weldon et al. | 156/345.1 |
| 2003/0136428 A1 * | 7/2003 | Krogh | 134/28 |
| 2003/0173526 A1 * | 9/2003 | Popiolkowski et al. | 250/492.1 |
| 2003/0221702 A1 * | 12/2003 | Peebles | 134/1 |
| 2004/0045574 A1 * | 3/2004 | Tan | 134/1 |
| 2004/0056211 A1 * | 3/2004 | Popiolkowski et al. | 250/492.1 |
| 2004/0099285 A1 * | 5/2004 | Wang et al. | 134/8 |

FOREIGN PATENT DOCUMENTS

| | | |
|---|---|---|
| EP | 1 049 133 A2 | 11/2000 |
| FR | 2 562 097 A1 | 10/1985 |
| JP | 63-149396 | 6/1998 |

* cited by examiner

*Primary Examiner*—Sharidan Carrillo
(74) *Attorney, Agent, or Firm*—Ashok A. Janah

(57) ABSTRACT

In a method of cleaning metal-containing deposits such as tantalum from a surface of a process chamber component, such as a metal surface, the surface is immersed in a cleaning solution. In one version, the cleaning solution is a solution having HF and $HNO_3$ in a ratio that removes deposits from the surface substantially without eroding the surface. In another version, the cleaning solution is a solution having KOH and $H_2O_2$. The solution can be treated after cleaning the surface to recover tantalum-containing materials and one or more of the cleaning solutions.

14 Claims, 5 Drawing Sheets

CLEANING CHAMBER SURFACES TO RECOVER METAL-CONTAINING COMPOUNDS

CROSS-REFERENCE

This application is a continuation-in-part of U.S. patent application Ser. No. 10/304,535, entitled "Method of Cleaning a Coated Process Chamber Component" to Wang et al, assigned to Applied Materials, Inc. and filed on Nov. 25, 2002, which is herein incorporated by reference in its entirety.

BACKGROUND

The present invention relates to the cleaning and recovery of metal-containing residues such as tantalum from the surface of processing chamber components.

In the processing of substrates, such as semiconductor wafers and displays, a substrate is placed in a process chamber and exposed to an energized gas to deposit or etch material on the substrate. During such processing, process residues are generated and deposited on internal surfaces in the chamber. For example, in sputter deposition processes, material sputtered from a target for deposition on a substrate also deposits on other component surfaces in the chamber, such as on deposition rings, cover ring, shadow rings, inner shield, upper shield, wall liners, and focus rings. In subsequent process cycles, the deposited process residues can "flake off" from the chamber component surfaces to fall upon and contaminate the substrate. Consequently, the deposited process residues are periodically cleaned from the chamber surfaces.

However, it is difficult to clean process deposits that contain metals such as tantalum from chamber components, especially when the components are made of metal-containing materials. When tantalum is sputter deposited onto the substrate, some of the sputtered tantalum deposits upon the adjacent chamber component surfaces. These tantalum process deposits are difficult to remove because cleaning solutions suitable for their removal are also frequently reactive with other metals, such as titanium, that are used to form chamber components. Cleaning of tantalum-containing materials from such surfaces can erode the components and require their frequent replacement. The erosion of metal surfaces can be especially problematic when cleaning textured metal surfaces, such as surfaces formed by a "Lavacoat™" process. These surfaces have crevices and pores in which tantalum-containing process residues get lodged, making it difficult to remove these residues with conventional cleaning process.

When conventional cleaning methods are used to clean tantalum, an amount of the tantalum-containing material generated in these process is not recovered. It is estimated that in many tantalum deposition processes, only about one-half of the sputtered tantalum material is deposited on the substrate, the rest being deposited on component surfaces within the chamber. Conventional cleaning methods frequently dispose of the used cleaning solutions along with the dissolved tantalum material. Thus, a large amount of tantalum material is wasted after it is cleaned off the chamber surfaces, resulting in an estimated loss of about 30,000 pounds of tantalum per year. The disposal of tantalum is environmentally undesirable and costly because high purity tantalum is expensive and fresh cleaning solution has to be acquired.

Thus, it is desirable to have a method of cleaning metal-containing deposits such as tantalum-containing deposits from surfaces of components without excessively eroding the surfaces. It is also desirable to reduce the waste of the tantalum materials cleaned off the chamber surfaces. It is further desirable to have a method of recovering cleaning solutions which are used to clean the tantalum-containing residues.

SUMMARY

A method of cleaning metal-containing deposits, such as tantalum-containing deposits, from a surface of a process chamber component includes immersing the surface in a cleaning solution. The cleaning solution has a ratio of HF to $HNO_3$ of from about 1:8 to about 1:30 by weight, such that the metal-containing deposits are removed from the surface substantially without eroding the surface.

In another version of the cleaning method, the surface is immersed in a solution of KOH and $H_2O_2$, in which the ratio of KOH to $H_2O_2$ in the solution is from about 6:1 to about 12:1 by moles, such that the deposits are removed from the surface substantially without eroding the surface.

In yet another version, a metal surface is immersed in an electrochemical etching bath solution, and the metal surface is electrically biased to electrochemically etch the metal-containing deposits from the metal surface.

Tantalum-containing compounds can also be recovered from the cleaning solutions. In one recovery method, a solution having dissolved tantalum-containing compounds and other metal-containing compounds is treated by adding a precipitating agent to the solution to form mixed solids having the tantalum-containing compounds and the other metal-containing compounds. The mixed solids are filtered from the solution. A metal-selective acid solution is added to the mixed solids, the metal-selective acid solution having a metal-selective acid that dissolves the other metal-containing compounds substantially without dissolving the tantalum-containing compounds. The tantalum-containing compounds are separated from the dissolved other metal-containing compounds.

In another recovery method, an aqueous solution having dissolved tantalum-containing compounds is treated by combining it with an organic solution that is capable of extracting the tantalum-containing compounds from the aqueous solution. The organic solution is separated from the aqueous solution. The tantalum-containing compounds are then pyrohydrolytically decomposed.

DRAWINGS

These features, aspects, and advantages of the present invention will become better understood with regard to the following description, appended claims, and accompanying drawings, which illustrate examples of the invention. However, it is to be understood that each of the features can be used in the invention in general, not merely in the context of the particular drawings, and the invention includes any combination of these features, where:

DESCRIPTION

Figure 1:
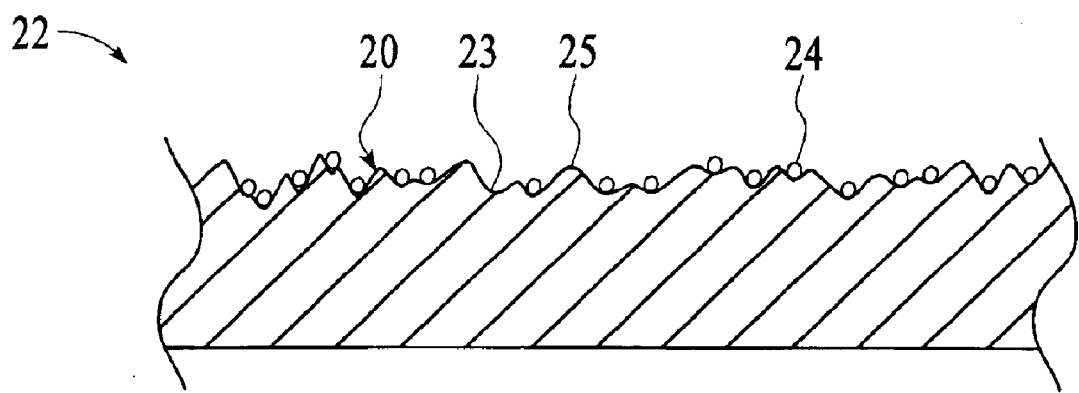
FIG. 1 is a schematic side view of an embodiment of a component having a surface with metal-containing deposits thereon.

A process chamber component 22 having a surface 20 is cleaned to remove metal-containing process deposits 24, such as tantalum-containing deposits 24, that are generated during processing of a substrate 104, as shown for example in FIG. 1. The tantalum-containing deposits can comprise, for example, at least one of tantalum metal, tantalum nitride and tantalum oxide. Performing a cleaning process to remove the tantalum-containing deposits 24 can reduce the formation of contaminant particles in the chamber 106, improve substrate yields, and allow recovery of tantalum from the cleaning solution. The chamber components 22 to be cleaned are those that accumulate metal and tantalum-containing process deposits 24, such as for example, portions of a gas delivery system 112 that provides process gas in the chamber 106, a substrate support 114 that supports the substrate 104 in the chamber 106, a gas energizer 116 that energizes the process gas, chamber enclosure walls 118 and shields 120, or a gas exhaust 122 that exhausts gas from the chamber 106, exemplary embodiments of which are shown in FIG. 4.

Figure 4:
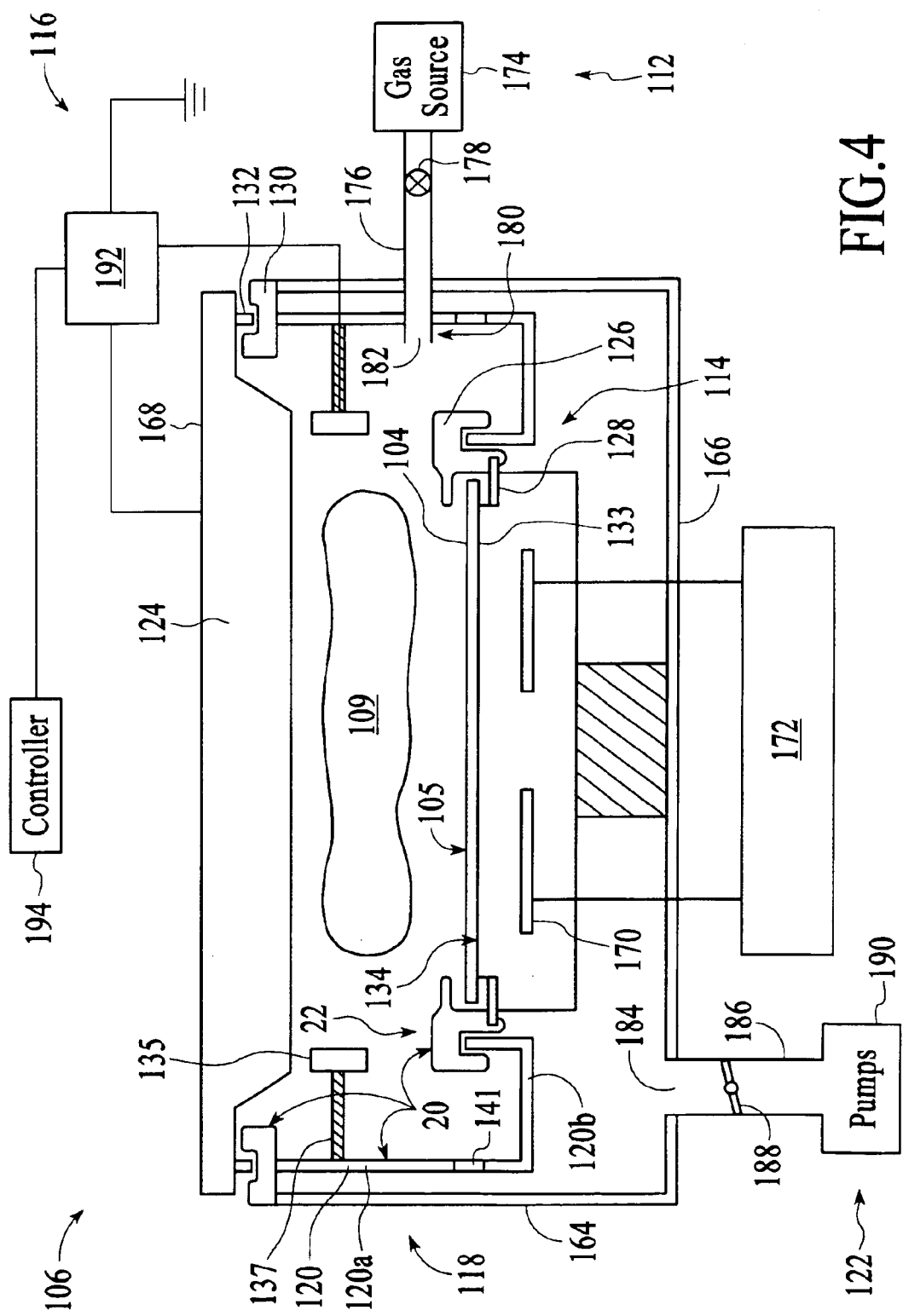
FIG. 4 is a sectional side view of an embodiment of a process chamber having one or more components that can be cleaned of metal-containing deposits in a cleaning process.

Referring to FIG. 4, which illustrates an embodiment of a physical vapor deposition chamber 106, components 22 that can be cleaned include a chamber enclosure wall 118, a chamber shield 120, including upper and lower shields 120a, b, a target 124, a cover ring 126, a deposition ring 128, a support ring 130, insulator ring 132, a coil 135, coil support 137, shutter disk 133, clamp shield 141, and a surface 134 of the substrate support 114. The components 22 can have surfaces 20 comprising metal, such as at least one of titanium, stainless steel, aluminum, and tantalum. The surfaces 20 can also comprise a ceramic material, such as at least one of aluminum oxide, aluminum nitride, and silicon oxide.

A cleaning step to remove process deposits 24 can comprise exposing the surface 20 of the component 22 to an acidic cleaning solution that is capable of at least partially removing the process deposits 24 from the surface 20 of the component 22. The acidic solution comprises dissolved acidic species that are capable of reacting with and removing process deposits 24 from all the surface 20 of the component 22, for example, by reacting with the process deposits 24 to form species that readily dissolve in the acidic solution. However, the acidic solution does not excessively corrode or otherwise damage the exposed portions of the surface 20 of the component 22 after the process deposits 24 are removed from that portion of the component 22. The surface 20 can be exposed to the acidic solution by dipping, immersing or otherwise contacting portions of the surface 20 with the acidic solution. The surface 20 of the coated component 22 may be immersed in the acidic solution for from about 3 to about 15 minutes, such as about 8 minutes, but may also be immersed for other times depending on the composition and thickness of the process deposit materials.

The composition of the acidic cleaning solution is selected according to the composition of the surface 20, and the composition of the process deposits 24. In one version, the acidic solution comprises hydrofluoric acid (HF). Hydrofluoric acid can react with and dissolve impurities that may have accumulated on the surface 20. The acidic solution may additionally or alternatively comprise a non-fluorinated acid, such as nitric acid ($HNO_3$.) The non-fluorinated agent may provide less aggressive chemical species, which allows for the cleaning and preparation of the surface 20 with reduced formation of erosion cracks through the underlying component structure. Additionally, the acidic solution provided to clean the surface 20 can comprise a suitably small concentration of the acidic species to reduce corrosion of the component 22 by the acidic solution. A suitable concentration of acidic species may be less than about 15 M acidic species, such as from about 2 to about 15 M acidic species. For a component 22 comprising a surface 20 comprising aluminum oxide or stainless steel, a suitable acidic solution may comprise from about 2 M to about 8 M HF, such as about 5 M HF, and from about 2 M $HNO_3$ to about 15 M $HNO_3$, such as about 12 M $HNO_3$. For a component 22 comprising a surface 20 comprising titanium, a suitable acidic solution may comprise from about 2 M to about 10 M $HNO_3$. In one version, a suitable acidic solution may comprise 5 M HF and 12 M $HNO_3$.

It has further been discovered that the cleaning method can be improved to clean tantalum-containing residues by immersing the surface 20 in a solution having a ratio of HF to $HNO_3$ that is selected to remove the tantalum-containing deposits substantially without eroding the surface 20, and especially without eroding metal surfaces 20. In particular, it has been discovered that selecting a ratio of HF to $HNO_3$ that is sufficiently low can reduce erosion of the surface 20, and can especially reduce the erosion of metal surfaces 20. A suitable ratio of HF to $HNO_3$ may be a ratio that is less than about 1:8 by weight. For example, the cleaning solution can comprise a ratio of HF to $HNO_3$ of from about 1:8 to about 1:30 by weight, and even from about 1:12 to about 1:20 by weight, such as about 1:15 by weight. A concentration of HF in solution is desirably maintained at less than about 10% by weight, such as from about 2% to about 10% by weight, and even about 5% by weight. A concentration of $HNO_3$ in solution is desirably at least about 60% by weight, such as from about 60% to about 67% by weight, and even about 65% by weight.

The improved cleaning results are at least in part because the $HNO_3$ reacts with the surfaces 20, such as metal surfaces, to form an oxidized and etch-resistant protective layer on the surface that inhibits etching of the surface 20. At a sufficiently low ratio, the $HNO_3$ and HF work in concert to remove the tantalum-containing deposits substantially without eroding the surface 20. The HF etches away and dissolves the tantalum-containing deposits, and thus exposes portions of the surface 20. The $HNO_3$ also etches tantalum-containing deposits, although at a lower etching rate, and as a strong oxidizer further reacts with and oxidizes the exposed portions of the surface 20 to form the protective etch-resistant layer. Thus, by maintaining a concentration of $HNO_3$ that is sufficiently high with respect to the concentration of HF in the solution, an excess of $HNO_3$ can be used to protect the surface 20 from erosion.

In the cleaning process, fresh HF can be added to the cleaning solution to replenish depleted HF. The HF in solution becomes depleted by, for example, reacting with tantalum-containing deposits 24 to form tantalum fluoride compounds. The HF depletion gradually slows down the removal of the tantalum-containing deposits from the surface 20. Addition of fresh HF allows the tantalum-containing deposits 24 to be removed from the surface 20 at a desired rate.

In another version, the tantalum-containing deposits 24 are cleaned from the surface 20 by immersing the surface 20 in a cleaning solution comprising KOH and $H_2O_2$. The cleaning solution has a ratio of KOH to $H_2O_2$ that is selected to remove the tantalum-containing deposits substantially without eroding the surface 20, and in particular substantially without eroding metal surfaces. A suitable ratio of KOH to $H_2O_2$ is from about 6:1 to about 10:1 by mole, such as about 7.5:1. A ratio that is lower or higher than the desired ratio range can reduce the selectivity towards the tantalum-containing deposits, and result in etching and erosion of the surface 20, respectively. A suitable concentration of KOH in solution is, for example, from about 5 M to about 12 M, and even from about 5 M to about 10 M, such as about 7 M. A suitable concentration of $H_2O_2$ in solution is, for example, from about 0.5 M to about 2.5 M, and even from about 0.5 M to about 2 M, such as about 1 M. Also, it has been discovered that maintaining a proper temperature of the cleaning solution comprising KOH and $H_2O_2$ can improve the removal of tantalum-containing deposits 24 by increasing the deposit removal rate. A suitable temperature of the cleaning solution may be at least about 70° C., such as from about 80 to about 95° C., and even at least about 90° C.

Figure 2:
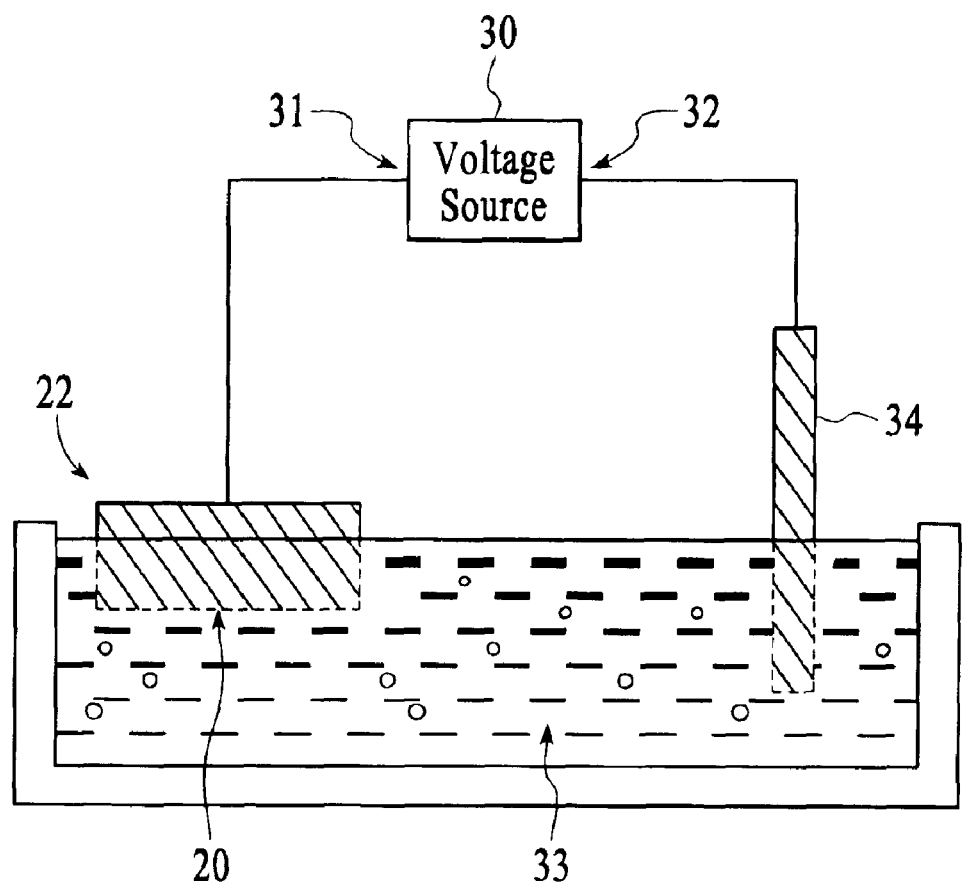
FIG. 2 is a schematic side view of an embodiment of an electrochemical etching apparatus.

In yet another version of the cleaning method, a metal surface 20 is cleaned in an electrochemical etching process. In this process, the surface 20 of the component 22 serves as an anode and is connected to a positive terminal 31 of a voltage source 30, as shown for example in FIG. 2. The metal surface 20 is immersed in an electrochemical bath 33 having a bath solution comprising electrolytes. The electrochemical bath solution can also or alternatively comprise an etching agent that selectively etches the tantalum-containing deposits, such as at least one of HF, $HNO_3$, KOH and $H_2O_2$. For example, the electrochemical bath can comprise one of the $HF/HNO_3$ or $KOH/H_2O_2$ cleaning solutions described above. The bath solution can also comprise other cleaning agents such as HCl, $H_2SO_4$ and methanol. In one version, the bath selectively electrochemically etches tantalum-containing deposits with a solution comprising HF, $H_2SO_4$ and methanol. A cathode 34 connected to the negative terminal 32 of the voltage source 30 is also immersed in the bath 33. Application of a bias voltage to the metal surface 20 and cathode 34 from the voltage source 30 induces a change in oxidation state of the tantalum-containing residues 24 on the surface 20 that can change tantalum-containing deposits 24, such as tantalum metal, into ionic forms that are soluble in the electrochemical etching bath solution, thus "etching" the tantalum-containing deposits 24 away from the surface 20. The electrochemical etching process conditions, such as the voltage applied to the metal surface 20, the pH of the electrochemical etching solution, and the temperature of the solution, are desirably maintained to selectively remove tantalum-containing deposits from the metal surface 20 substantially without eroding the metal surface 20.

These cleaning methods are particularly suitable for surfaces 20 that are textured, as shown for example in FIG. 1. Components 22 having textured surfaces reduce particle generation in the process chamber by providing a "sticky" surface to which process residues adhere. In one version, components 20 cleaned of tantalum-containing deposits include components having surfaces textured by a "Lavacoat™" process, such as for example components described in U.S. patent application Ser. No. 10/653,713 to West, et al, filed on Sep. 2, 2002, entitled "Fabricating and Cleaning Chamber Components Having Textured Surfaces," U.S. patent application Ser. No. 10/099,307, filed Mar. 13, 2002, to Popiolkowski et al, and U.S. patent application Ser. No. 10/622,178, filed on Jul. 17, 2003 to Popiolkowski et al., all commonly assigned to Applied Materials, Inc., all of which are incorporated herein by reference in their entireties. The components 22 can also comprise coated components having textured surfaces, such as plasma sprayed coatings or twin-wire arc sprayed coatings, as described for example in the parent of the present application U.S. patent application Ser. No. 10/304,535 to Wang et al, filed on Nov. 25, 2002, commonly assigned to Applied Materials, from which the present application claims priority, and which is also incorporated herein by reference in its entirety.

The "Lavacoat™" textured metal surface 20 is formed by generating an electromagnetic energy beam and directing the beam onto the surface 20 of the component 22. The electromagnetic energy beam is preferably an electron beam, but can also comprise protons, neutrons and X-rays and the like. The electron beam is typically focused on a region of the surface 20 for a period of time, during which time the beam interacts with the surface 20 to form features on the surface. It is believed that the beam forms the features by rapidly heating the region of the surface 20, in some cases to a melting temperature of the surface material. The rapid heating causes some of the surface material to be ejected outwards, which forms depressions 23 in the regions the material was ejected from, and protuberances 25 in areas where the ejected material re-deposits. After the desired features in the region are formed, the beam is scanned to a different region of the component surface 20 to form features in the new region. The final surface 20 can comprise a honeycomb-like structure of depressions 23 and protuberances 25 formed in the surface 20. The features formed by this method are typically macroscopically sized, and the depressions can range in diameter from about 0.1 mm to about 3.5 mm, such as from about 0.8 to about 1.0 mm in diameter. The "Lavacoat™" textured surface 20 has an overall surface roughness average of from about 2500 microinches (63.5 micrometers) to about 4000 microinches (101.6 micrometers), the roughness average of the surface 20 being defined as the mean of the absolute values of the displacements from the mean line of the features along the surface 20.

The instant cleaning methods provide surprisingly good results in cleaning such textured surfaces substantially without eroding the surfaces 20. For example, for a textured metal surface 20 formed of titanium, the cleaning methods described above may clean tantalum-containing residues from the surface 20 while eroding less than about 1 $mg/cm^2$ per hour of titanium from the metal surface 20. In contrast, conventional tantalum cleaning processes can erode more than about 5 $mg/cm^2$ of titanium from a titanium surface of a component 22. As another example, a solution of KOH and $H_2O_2$ having the selected molar ratio of from about 6:1 to about 10:1 and a temperature of from about 80 to about 95° C., can clean tantalum-containing deposits at a rate that is about 20 times faster than the rate at which a titanium component surface 20 is eroded, allowing the surface 20 to be cleaned substantially without excessive erosion.

Once cleaning of the component surface 20 has been completed, the cleaning solution can be treated to recover metal-containing materials, such as the tantalum-containing materials, which may be at least one of tantalum metal and tantalum oxide. Recovering tantalum-containing materials from the cleaning solution reduces the pollution of the environment by tantalum waste, and can also reduce the costs associated with proper disposal of waste tantalum. The recovered tantalum-containing materials can be re-used in the substrate processing, for example the recovered tantalum materials can be used to form a tantalum-containing target for physical vapor deposition processes. In addition to tantalum recovery, the used cleaning solution can be treated to allow for re-use of the cleaning solution. For example, the cleaning solution can be treated to recover a re-useable solution of HF and $HNO_3$.

Figure 3A:
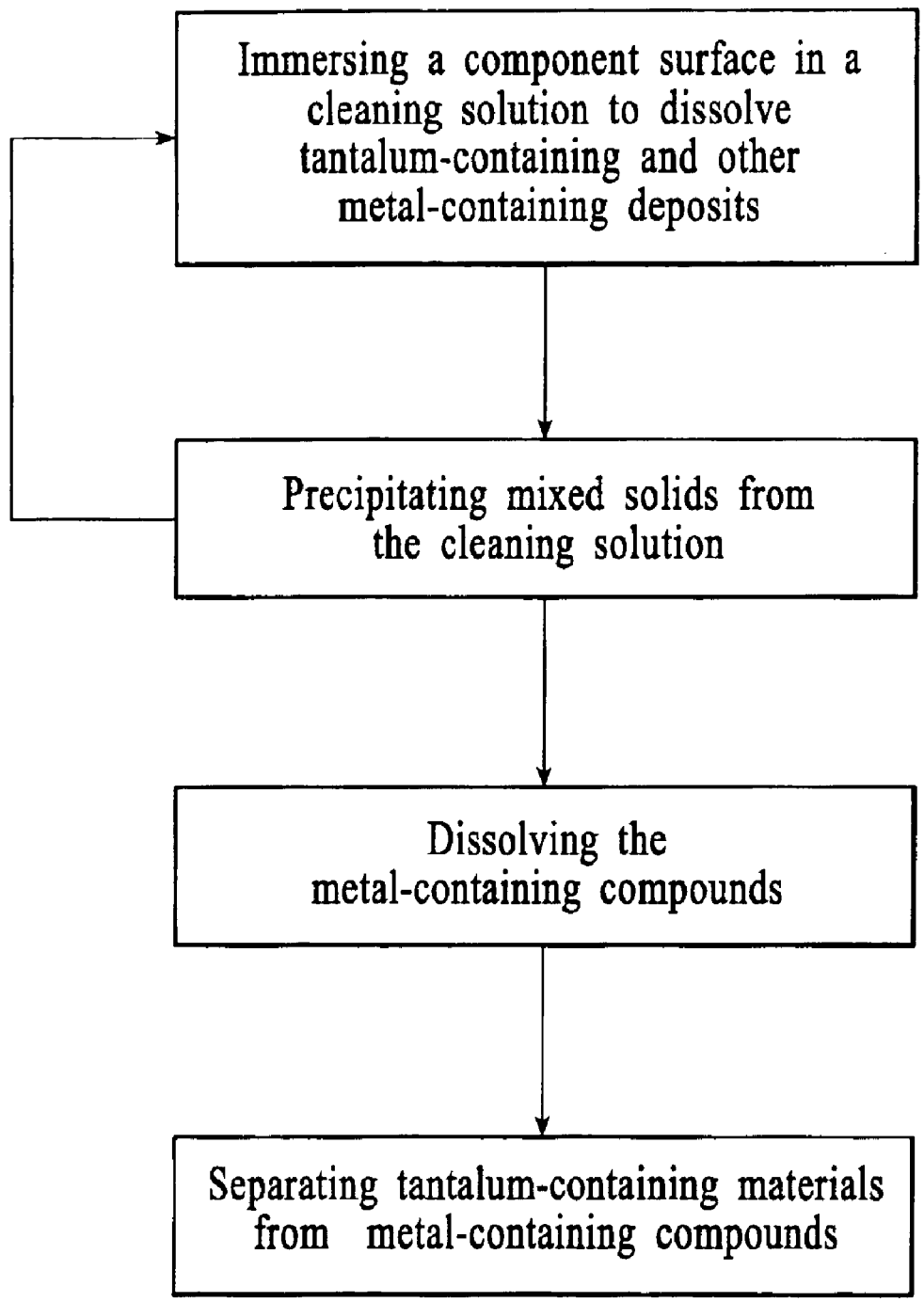
FIG. 3a is a flow chart showing an embodiment of a method for recovering tantalum-containing compounds.

A flow chart showing one version of a method of cleaning a component and recovering tantalum-containing materials is shown in FIG. 3a. In the first step of this method, the component surface 20 is cleaned by immersing in a cleaning solution, which dissolves tantalum and other metal-containing residues in the solution to form tantalum and metal-containing compounds, respectively. After the component surface 20 has been cleaned, a precipitating agent is added to the cleaning solution to precipitate metal-containing compounds out of the solution and form mixed solids. The mixed solids comprise tantalum-containing compounds such as tantalum oxides, and also comprise other metal-containing compounds, such as compounds comprising aluminum, titanium and iron. In one version, the cleaning solution may be recovered and re-used to clean subsequent components 22 once the mixed solids have been precipitated out of and removed from the solution, as indicated by the arrow in FIG. 3a. In one method of precipitating the mixed solids, the cleaning solution is neutralized by adding a precipitating agent comprising an acid or base to bring the pH of the solution from a pH of less than about 1 to about 7. For example, for a cleaning solution comprising HF and $HNO_3$, a base can be added to neutralize the solution. For a cleaning solution comprising KOH and $H_2O_2$, an acid can be added to neutralize the solution. A suitable neutralizing acid can comprise at least one of $HNO_3$, $H_2SO_4$ and $H_3PO_4$. A suitable neutralizing base can comprise at least one of NaOH, KOH and $CaCO_3$. The mixed solids are then separated from the cleaning solution, for example by filtering the mixed solids from the solution.

To separate the tantalum-containing compounds from the other metal-containing compounds, a metal-selective acid solution is added to the mixed solids. The metal-selective acid solution comprises a metal-selective acid that dissolves metal-containing compounds in the acid solution substantially without dissolving the tantalum-containing compounds. A suitable metal-selective acid can comprise, for example, HCl. The solid tantalum-containing compounds are separated from the acid solution having the dissolved metal-containing compounds by, for example, filtering the tantalum-containing solids, or by decanting the acid solution from the tantalum-containing solids. The tantalum-containing compound can then be converted into tantalum oxide, for example by heating.

Figure 3B:
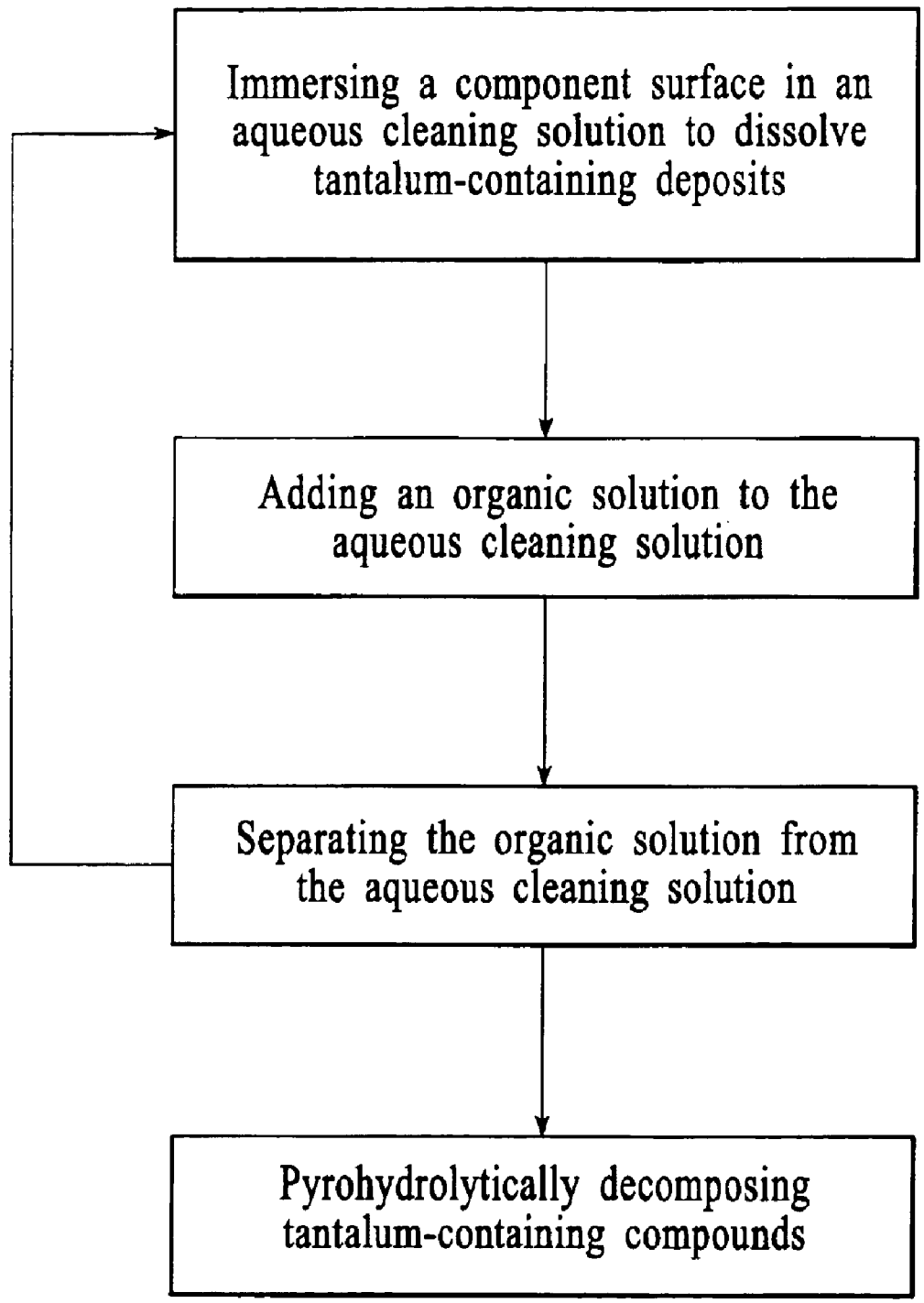
FIG. 3b is a flow chart showing another embodiment of a method for recovering tantalum-containing compounds.

Yet another method of cleaning a component and recovering tantalum-containing materials is shown in the flow chart of FIG. 3b. The component surface 20 is cleaned by immersing the surface 20 in an aqueous cleaning solution to dissolve tantalum-containing compounds from the surface 20. After the cleaning the surface 20, tantalum-containing compounds are removed from the cleaning solution in a liquid-to-liquid extraction process. The extraction process comprises combining the aqueous cleaning solution with an organic solution that is substantially non-miscible with the aqueous solution. The organic solution is a solution in which the tantalum-containing compounds are highly soluble, and that is capable of extracting the tantalum-containing compounds from the aqueous solution. A suitable organic solution for extracting the tantalum-containing compounds can comprise, for example, at least one of methyl isobutyl ketone, diethyl ketone, cyclohexone, diisobutyl ketone, and tributyl phosphate. Once the tantalum-containing compounds have been extracted into the organic solution, the organic and aqueous solutions are separated, for example by allowing the solutions to divide into separate organic and aqueous phases, and draining one of the solutions from the other. The separated aqueous solution can be retained and re-used as a cleaning solution, as shown by the arrow in FIG. 3b. For example, the aqueous solution can comprise HF and $HNO_3$ that remain in the aqueous solution during the extractions, and which can be re-used in subsequent cleaning processes to remove tantalum-containing residues from metal surfaces 22.

After the extraction process, the tantalum-containing compounds in the organic solution can be pyrohydrolytically decomposed. In the pyrohydrolytic decomposition, the tantalum-containing compounds are heated to a temperature at which the compounds react with oxygen to form tantalum oxide compounds, such as a temperature of at least about 120° C., such as from about 120° C. to about 180° C. The organic solution and any decomposition reaction products can be evaporated from the tantalum oxide compounds during the pyrohydrolytic decomposition process. Alternatively, the organic solution can be removed from the tantalum-containing compounds in a separate step. The tantalum oxide compounds can also be further treated to form tantalum metal, for example by heating the tantalum oxide compounds in a furnace.

An example of a suitable process chamber 106 having a component 22 that is cleaned to remove metal-containing deposits 24 such as tantalum-containing deposits 24 is shown in FIG. 4. The chamber 106 can be a part of a multi-chamber platform (not shown) having a cluster of interconnected chambers connected by a robot arm mechanism that transfers substrates 104 between the chambers 106. In the version shown, the process chamber 106 comprises a sputter deposition chamber, also called a physical vapor deposition or PVD chamber, that is capable of sputter depositing material on a substrate 104, such as one or more of tantalum, tantalum nitride, titanium, titanium nitride, copper, tungsten, tungsten nitride and aluminum. The chamber 106 comprises enclosure walls 118 that enclose a process zone 109, and that include sidewalls 164, a bottom wall 166, and a ceiling 168. A support ring 130 can be arranged between the sidewalls 164 and ceiling 168 to support the ceiling 168. Other chamber walls can include one or more shields 120 that shield the enclosure walls 118 from the sputtering environment.

The chamber 106 comprises a substrate support 114 to support the substrate in the sputter deposition chamber 106. The substrate support 114 may be electrically floating or may comprise an electrode 170 that is biased by a power supply 172, such as an RF power supply. The substrate support 130 can also comprise a moveable shutter disk 133 that can protect the upper surface 134 of the support 130 when the substrate 104 is not present. In operation, the substrate 104 is introduced into the chamber 106 through a substrate loading inlet (not shown) in a sidewall 164 of the chamber 106 and placed on the support 114. The support 114 can be lifted or lowered by support lift bellows and a lift finger assembly (not shown) can be used to lift and lower the substrate onto the support 114 during transport of the substrate 104 into and out of the chamber 106.

The support 114 may also comprise one or more rings, such as a cover ring 126 and a deposition ring 128, that cover at least a portion of the upper surface 134 of the support 114 to inhibit erosion of the support 130. In one version, the deposition ring 128 at least partially surrounds the substrate 104 to protect portions of the support 114 not covered by the substrate 104. The cover ring 126 encircles and covers at least a portion of the deposition ring 128, and reduces the deposition of particles onto both the deposition ring 128 and the underlying support 114.

A process gas, such as a sputtering gas, is introduced into the chamber 106 through a gas delivery system 112 that includes a process gas supply comprising one or more gas sources 174 that each feed a conduit 176 having a gas flow control valve 178, such as a mass flow controller, to pass a set flow rate of the gas therethrough. The conduits 176 can feed the gases to a mixing manifold (not shown) in which the gases are mixed to from a desired process gas composition. The mixing manifold feeds a gas distributor 180 having one or more gas outlets 182 in the chamber 106. The process gas may comprise a non-reactive gas, such as argon or xenon, which is capable of energetically impinging upon and sputtering material from a target. The process gas may also comprise a reactive gas, such as one or more of an oxygen-containing gas and a nitrogen-containing gas, that are capable of reacting with the sputtered material to form a layer on the substrate 104. Spent process gas and byproducts are exhausted from the chamber 106 through an exhaust 122 which includes one or more exhaust ports 184 that receive spent process gas and pass the spent gas to an exhaust conduit 186 in which there is a throttle valve 188 to control the pressure of the gas in the chamber 106. The exhaust conduit 186 feeds one or more exhaust pumps 190. Typically, the pressure of the sputtering gas in the chamber 106 is set to sub-atmospheric levels.

The sputtering chamber 106 further comprises a sputtering target 124 facing a surface 105 of the substrate 104, and comprising material to be sputtered onto the substrate 104, such as for example at least one of tantalum and tantalum nitride. The target 124 is electrically isolated from the chamber 106 by an annular insulator ring 132, and is connected to a power supply 192. The sputtering chamber 106 also has a shield 120 to protect a wall 118 of the chamber 106 from sputtered material. The shield 120 can comprise a wall-like cylindrical shape having upper and lower shield sections 120a, 120b that shield the upper and lower regions of the chamber 106. In the version shown in FIG. 4, the shield 120 has an upper section 120a mounted to the support ring 130 and a lower section 120b that is fitted to the cover ring 126. A clamp shield 141 comprising a clamping ring can also be provided to clamp the upper and lower shield sections 120a,b together. Alternative shield configurations, such as inner and outer shields, can also be provided. In one version, one or more of the power supply 192, target 124, and shield 120, operate as a gas energizer 116 that is capable of energizing the sputtering gas to sputter material from the target 124. The power supply 192 applies a bias voltage to the target 124 with respect to the shield 120. The electric field generated in the chamber 106 from the applied voltage energizes the sputtering gas to form a plasma that energetically impinges upon and bombards the target 124 to sputter material off the target 124 and onto the substrate 104. The support 114 having the electrode 170 and support electrode power supply 172 may also operate as part of the gas energizer 116 by energizing and accelerating ionized material sputtered from the target 124 towards the substrate 104. Furthermore, a gas energizing coil 135 can be provided that is powered by a power supply 192 and that is positioned within the chamber 106 to provide enhanced energized gas characteristics, such as improved energized gas density. The gas energizing coil 135 can be supported by a coil support 137 that is attached to a shield 120 or other wall in the chamber 106.

The chamber 106 is controlled by a controller 194 that comprises program code having instruction sets to operate components of the chamber 106 to process substrates 104 in the chamber 106. For example, the controller 194 can comprise a substrate positioning instruction set to operate one or more of the substrate support 114 and substrate transport to position a substrate 104 in the chamber 106; a gas flow control instruction set to operate the flow control valves 178 to set a flow of sputtering gas to the chamber 106; a gas pressure control instruction set to operate the exhaust throttle valve 188 to maintain a pressure in the chamber 106; a gas energizer control instruction set to operate the gas energizer 116 to set a gas energizing power level; a temperature control instruction set to control temperatures in the chamber 106; and a process monitoring instruction set to monitor the process in the chamber 106.

Although exemplary embodiments of the present invention are shown and described, those of ordinary skill in the art may devise other embodiments which incorporate the present invention, and which are also within the scope of the present invention. For example, other chamber components than the exemplary components described herein can also be cleaned. Additional cleaning and recovery steps other than those described could also be performed. Furthermore, relative or positional terms shown with respect to the exemplary embodiments are interchangeable. Therefore, the appended claims should not be limited to the descriptions of the preferred versions, materials, or spatial arrangements described herein to illustrate the invention.

What is claimed is:

1. A method of cleaning tantalum-containing deposits from a surface of a process chamber component, the method comprising:
   immersing the surface of the component comprising the tantalum-containing deposits in a cleaning solution comprising a ratio of HF to $HNO_3$ of from about 1:8 to about 1:30 by weight to clean tantalum-containing deposits from the surface,
   whereby the tantalum-containing deposits are removed from the surface substantially without eroding the surface.

2. A method according to claim 1 wherein the solution comprises less than about 10% by weight of HF.

3. A method according to claim 1 further comprising prior to the step immersing, exposing the surface of the process chamber component to an energized gas.

4. A method according to claim 1 wherein the surface of the process chamber component has a textured surface having a surface roughness average of from about 63.5 micrometers to about 101.6 micrometers, and further comprising immersing the textured surface in the cleaning solution.

5. A method to claim 1 wherein the surface of a process chamber component has a textured surface having depressions with diameters of from about 0.1 mm to about 3.5 mm, and further comprising immersing the textured surface in the cleaning solution.

6. A component cleaned according to the method of claim 1, the component comprising a portion of one or more of an enclosure wall, chamber shield, target, cover ring, deposition ring, support ring, insulator ring, coil, coil support, shutter disk, clamp shield, and substrate support; and
   wherein the component is substantially absent tantalum-containing deposits after cleaning of the component.

7. A method according to claim 1 wherein the cleaning solution comprises at least about 60% by weight of $HNO_3$.

8. A method according to claim 3 wherein the surface of the process chamber component is a metal surface.

9. A method according to claim 3 wherein the surface of the process chamber component is a ceramic surface.

10. A method of cleaning tantalum-containing deposits from a textured surface of a process chamber component, the method comprising:

(a) providing a component having a textured surface, the textured surface comprising electron beam textured depressions having the tantalum-containing deposits therein; and (b) immersing the electron beam textured depressions of the textured surface in a cleaning solution comprising a ratio of HF to $HNO_3$ of from about 1:8 to about 1:30 by weight, to clean the tantalum-containing deposits from the electron beam textured depressions, whereby the tantalum-contained deposits removed from the textured surface substantially without eroding the textured surface.

11. A method according to claim 10 wherein (b) the electron beam textured depressions have diameters of from about 0.1 mm to about 3.5 mm and further comprising immersing the textured surface in the cleaning solution.

12. A method according to claim 10 wherein (b) the textured surface has a surface roughness average of from about 63.5 micrometers to about 101.6 micrometers and further comprising immersing said textured surface in the cleaning solution.

13. A method according to claim 10 wherein (b) comprises immersing in a cleaning solution comprising less than about 10% by weight of HF.

14. A method according to claim 10 wherein (b) comprises immersing in a cleaning solution comprising at least about 60% by weight of $HNO_3$.

* * * * *